(12) United States Patent
Sakamoto et al.

(10) Patent No.: US 6,330,162 B2
(45) Date of Patent: *Dec. 11, 2001

(54) IC CARD MODULE, MANUFACTURING METHOD THEREFOR, HYBRID INTEGRATED CIRCUIT MODULE, AND MANUFACTURING METHOD THEREOF

(75) Inventors: Noriaki Sakamoto; Hisashi Shimizu, both of Gunma (JP)

(73) Assignee: Sanyo Electric Co., Ltd., Moriguchi (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/197,672

(22) Filed: Nov. 23, 1998

(30) Foreign Application Priority Data

Mar. 17, 1998 (JP) .................................................. 10-067333
Mar. 17, 1998 (JP) .................................................. 10-067334
May 28, 1998 (JP) .................................................. 10-147385

(51) Int. Cl.[7] .............................. H05K 1/14; H01L 23/28
(52) U.S. Cl. .......................... 361/737; 361/752; 361/736; 174/52.3; 235/492; 257/679; 29/841
(58) Field of Search .................................. 361/728, 736, 361/737, 752, 800; 174/50.5, 52.2, 52.3; 257/679; 235/492; 29/841, 837

(56) References Cited

U.S. PATENT DOCUMENTS

| 5,102,712 | * | 4/1992 | Peirce et al. ................. 361/765 X |
| 5,173,840 | * | 12/1992 | Kodai et al. ................. 361/752 X |
| 5,208,728 | * | 5/1993 | Schirmer ....................... 361/752 |
| 5,461,256 | * | 10/1995 | Yamada et al. ............... 361/737 X |
| 5,719,746 | * | 2/1998 | Ohbuchi et al. ............... 361/737 |
| 5,735,040 | * | 4/1998 | Ochi et al. ..................... 361/737 X |
| 5,867,371 | * | 2/1999 | Denzene et al. .............. 361/800 X |
| 5,962,840 | * | 10/1999 | Haghiri-Tehrani et al. ... 361/737 X |

FOREIGN PATENT DOCUMENTS 10-26934    1/1998   (JP) .

* cited by examiner

*Primary Examiner*—Jayprakash N. Gandhi
(74) *Attorney, Agent, or Firm*—Armstrong, Westerman, Hattori, McLeland & Naughton, LLP

(57) ABSTRACT

A support member 1 is previously molded, a hybrid integrated circuit substrate 45 is placed thereon, and the support member 1 on which the hybrid integrated circuit substrate 45 is placed is placed in a metal mold, then again molded of a thermoplastic resin 2. The poured high-temperature thermoplastic resin 2 strikes on the support member 1 whose bottom surface is directly contacted on the metal mold and the surface of the striking portion is melted and integrated without being deformed . Therefore, full mold substantially covering an entire surface of the substrate is enabled. Epoxy potting is applied to a semiconductor chip and a coil derivation part.

10 Claims, 7 Drawing Sheets

IC CARD MODULE, MANUFACTURING METHOD THEREFOR, HYBRID INTEGRATED CIRCUIT MODULE, AND MANUFACTURING METHOD THEREOF

BACKGROUND OF THE INVENTION

1. Field of the Invention

This invention relates to an IC card adopting a thermoplastic resin with a short solidification time, a hybrid integrated circuit device, and manufacturing methods therefor.

2. Description of the Related Art

Recently, good use of IC cards has been made in various places. For example, IC cards are in demand for ski lift tickets in a skiing ground, train tickets, a book of swimming pool tickets, etc., including credit cards; it is desired that the IC cards can be used even under hostile conditions.

Generally, two types of sealing methods are adopted from the viewpoint of cost merit. In one sealing method, such means putting a lid on an insulating substrate on which circuit elements of semiconductor elements, etc., are mounted, generally called a case is adopted for sealing. This structure is a hollow structure or a resin is poured into the hollow structure.

The other sealing method is transfer mold, famous as a semiconductor IC mold method. In the transfer mold, generally a thermosetting resin is adopted, a metal mold is raised to about 180 degrees, and the thermosetting resin is hardened (namely, thermally reacts and is polymerized and solidified) with the temperature maintained, then is taken out from the metal mold as a sealing body. To mount an IC chip on a lead frame, soldering is used, but generally is high-temperature soldering and a problem of solder melting does not arise.

However, the sealing structure using a case requires a margin in a substrate so that the case does not come in contact with elements therein, enlarging the outside size.

On the other hand, as seen from the description given above, the transfer mold involves hardening while heating and thus requires a long time for the process; productivity cannot be improved.

Then, the applicant paid attention to a thermoplastic resin not requiring a long time. The thermoplastic resin is heated and melted without hardening reaction and if cooled, it is solidified (namely, becomes solid without reaction). Therefore, after the thermoplastic resin is poured, it is solidified if cooled; sealing can be provided in a short time. However, to seal with a thermoplastic resin, for example, with injection mold, the resin temperature at the pouring time is high (about 300 degrees) and solder is melted, causing a failure in electric connection of circuit elements mounted in an insulating substrate.

Here, high-temperature solder may be used. However, considering degradation of insulating resin under a conductive pattern, low-melting-point solder is preferred. Then, the invention assumes that solder at about 180–250 degrees is adopted in the description to follow.

Generally, the rear face of an insulating substrate is exposed and there is a problem in insulation property between IC card insulating substrate and IC card module attachment chassis. There is a problem in resistance to humidity because of the entry of moisture on the interface between the exposed rear face of IC card insulating substrate and thermoplastic resin sealing the surroundings thereof.

If a substrate inferior in thermal conductivity, such as a printed-circuit board, a flexible sheet, a glass substrate, or a ceramic substrate, is used, solder is melted.

Further, in full mold using transfer mold, a gap is provided between the rear face of a substrate and a metal mold to draw a resin into the rear face of the insulating substrate. Thus, the gap is provided using a pin or by sandwiching the insulating substrate between the upper and lower metal mold parts. However, in injection mold using thermoplastic resin, injection pressure is high (50–200 Kg/cm2), thus the insulating substrate bends, a bonding wire is broken, etc.

A pin trace remains in the pin-supported point and the appearance worsens.

SUMMARY OF THE INVENTION

The invention is to overcome the above-described disadvantages:

first, by providing an IC card module comprising a support member being made of a thermoplastic resin and having an area on which at least a substrate is placed and a sealing member made of a thermoplastic resin into which an exposure part of the support member is melted and integrated; and second, by providing an IC card module comprising a support member being made of a thermoplastic resin and having a first groove and a second groove on which at least a substrate and a coil are placed and a sealing member made of a thermoplastic resin into which an exposure part of the support member is melted and integrated so as to substantially seal the substrate.

The thermoplastic resin is a material which is melted when reaching one temperature and is solidified when cooled. Thus, the support member made of a thermoplastic resin previously placed in a metal mold is melted upon reception of the heat of a poured thermoplastic resin and is integrated. Therefore, the IC card insulating substrate is molded in one piece with the support member and the poured thermoplastic resin and the rear face of the substrate can be covered. The dielectric strength characteristic and moisture resistance can be improved.

The invention is to overcome the above-described disadvantages third by providing an IC card module comprising a sealing member made up of a thermosetting resin provided covering solder and a thermoplastic resin into which an exposure part of the support member is melted and integrated so as to substantially seal the substrate.

The melting temperature of the thermoplastic resin is very high (about 300 degrees). However, a resin is applied to the solder portion, whereby the heat of the directly melted, poured resin is not transmitted and solder melting can be prevented.

The invention is to overcome the above-described disadvantages fourthly by providing an IC card module comprising a support member being made of a thermoplastic resin and having a first groove and a second groove on which at least a substrate and a coil are placed, the substrate being mounted in the first groove and having a semiconductor IC electrically connected to a conductive pattern formed on a surface of the substrate, the coil being mounted in the second groove and electrically connected to the conductive pattern of the substrate, and a sealing member made up of a thermosetting resin provided bridging the groove and a thermoplastic resin into which an exposure part of the support member is melted and integrated so as to substantially seal the substrate.

The injection pressure of the thermoplastic resin, for example, a PPS resin comes up to about 50–200 Kg/cm$^2$ and causes the coil or the insulating substrate to shift, but the coil and the substrate are buried in the grooves and therefore the shift can be prevented in addition to preventing of melting of the solder described above.

The invention is to overcome the above-described disadvantages fifthly by providing an IC card module comprising a support member being made of a thermoplastic resin and having an area on which at least a substrate is placed and means for abutting a metal mold on a plane, a line, or a point on a side and a sealing member made of a thermoplastic resin into which an exposure part of the support member is melted and integrated so as to substantially seal the substrate.

The substrate is molded in one piece with the thermoplastic resin and the rear face of the substrate can be covered. The dielectric strength characteristic and moisture resistance can be improved. Moreover, if the abutment means is provided on the side of the support member, the poured resin can be extended to the side and rear face of the support member and the exposure area of the support member can be lessened; furthermore moisture resistance can be improved.

The invention is to overcome the above-described disadvantages sixthly by providing an IC card module comprising a support member being made of a thermoplastic resin and having a first groove and a second groove on which at least a substrate and a coil are placed and means for abutting a metal mold on a plane, a line, or a point on a side, the substrate being mounted in the first groove and having a semiconductor IC electrically connected to a conductive pattern formed on a surface of the substrate, the coil being mounted in the second groove and electrically connected to the conductive pattern of the substrate, and a sealing member made of a thermoplastic resin into which an exposure part of the support member is melted and integrated so as to substantially seal the substrate.

In addition to the above-described advantages, since the grooves are formed and the parts are mounted therein, the parts do not shift even under high injection pressure proper to the thermoplastic resin and a failure, etc., can be prevented.

The invention is to overcome the above-described disadvantages seventhly by, as the thickness relationship between the support member and the sealing member, thinning the sealing member so that the support member can be prevented from warping.

When the melted thermoplastic resin is solidified, if it is contracted, owing to the strength of the support member, the IC card module can be prevented from warping.

The invention is to overcome the above-described disadvantages eighthly by making the thickness of said sealing member thinner than that of said support member.

The invention is to overcome the above-described disadvantages ninthly by providing an IC card module manufacturing method comprising the steps of providing a substrate having a surface undergoing insulating treatment, a conductive pattern formed on the surface, and a semiconductor element or a passive element electrically connected to the conductive pattern, providing a support member made of a thermoplastic resin, on which the substrate is mounted, having means for abutting a metal mold on a plane, a line, or a point on a side, holding the support member so that a rear face thereof abuts one metal mold part, pouring a melted thermoplastic resin into a space formed by the one metal mold part and an opposite metal mold part, and melting an exposure part of the support member by heat of the melted thermoplastic resin for molding in one piece.

Since the support member is provided, such a complicated structure wherein a space is provided on the rear face of the parts for placement need not be adopted. Therefore, a failure caused by the pressure exerted on the insulating substrate, the coil, etc., by the high injection pressure of the resin can be prevented.

The invention is to overcome the above-described disadvantages tenthly by providing a hybrid integrated circuit module manufacturing method comprising the steps of providing a substrate having a surface undergoing insulating treatment, a conductive pattern formed on the surface, and a semiconductor element or a passive element electrically connected to the conductive pattern, providing a support member made of a thermoplastic resin, on which the substrate is mounted, holding the support member so that a rear face thereof abuts one metal mold part, pouring a melted thermoplastic resin into a space formed by the one metal mold part and an opposite metal mold part, and molding in one piece so as to make thinner than the support member so that the support member can be prevented from warping.

When the melted thermoplastic resin is solidified, if it is contracted, owing to the strength of the support member, the IC card module can be prevented from warping.

The invention is to overcome the above-described disadvantages eleventhly and twelfthly by potting with a first resin reacting with the sealed material (semiconductor bare chip, fine metal wires or coil) and sealing with the thermoplastic resin.

Since the first resin reacts with the sealed element, no slip occurs if the support member warps due to heat.

The invention is to overcome the above-described disadvantages thirteenthly by applying satin work to the face of the sealing member opposed to the bottom of the support member, whereby if a surface sink occurs because of the groove formed in the support member, visual check can be made hard to make.

The invention is to overcome the above-described disadvantages fourteenthly by forming a second groove and placing a coil therein. According to the structure, coil is disposed within the groove appropriately without straying off from the position.

The invention is to overcome the above-described disadvantages fifteenthly by placing a potting resin for covering a semiconductor bear chip, placing a second resin for covering a first groove so as not to expose the surface of the potting resin, placing the support member in a metal mold, and sealing the support member with a thermoplastic resin; otherwise, the resin pouring pressure at the sealing time would be applied directly to the potting resin, warping the insulating substrate, leading to destruction of the chip.

The invention is to overcome the above-described disadvantages sixteenthly by providing a step on a peripheral part of said metal mold part.

DESCRIPTION OF THE PREFERRED EMBODIMENTS

Before embodiments of the invention are discussed, first, IC cards will be discussed briefly. Generally, a memory device such as flash memory and its peripheral circuitry are sealed in a thin plastic card in the form of an IC chip or a hybrid, or an IC with no memory is sealed. The IC cards containing memory are IC cards for rewriting data and storing the result therein or those for feeding data into a processor.

The cards include a card with an electrode exposed for signal transfer to and from a processor, a card to which a connector is attached, and a card in which a coil is sealed with an electrode not exposed.

Here, the type of card in which a coil is installed within a sealing member will be discussed. However, the invention can also be applied to the cards with an electrode exposed and the cards to which a connector is attached, needless to say.

The points to be noted to mold of a thermoplastic resin as a plastic card will be discussed briefly.

(1) Injection Molding Time

An epoxy resin used with transfer mold needs to be left alone while it is thermally hardened in a metal mold, but the thermoplastic resin needs to be simply cooled and the molding time can be shortened.

According to a document, while one cycle using epoxy is 30–180 seconds, that using thermoplastic resin of PPS is 10–20 seconds.

(2) Resin Yield

Although thermosetting resin cannot be recycled, thermoplastic resin can be recycled if heated; resin in a runner, etc., can be collected and recycled, whereby the yield can be improved.

(3) Injection Molding Conditions

Cylinder temperature: Is substantially the same as resin melting temperature and is about 290–320 degrees.

Metal mold temperature: About 140–150 degrees to solidify.

Injection pressure: 50–200 Kg/cm2 That is, if the problem in (3) is solved, costs can be drastically decreased because of (1) and (2).

(4) PPS (Polyphenylene Sulfide): One of Thermoplastic Resins

This resin, which is free of a hydrophilic group, has a water absorbing rate which is a half that of epoxy resin, but is inferior to epoxy resin in adhesion to leads and elements.

In the conventional transfer mold, a gap must be provided between the rear face of a substrate and a metal mold to draw a resin into the rear face of the substrate. However, if a thermoplastic resin is thus molded, injection pressure causes the substrate to warp.

Figure 1:
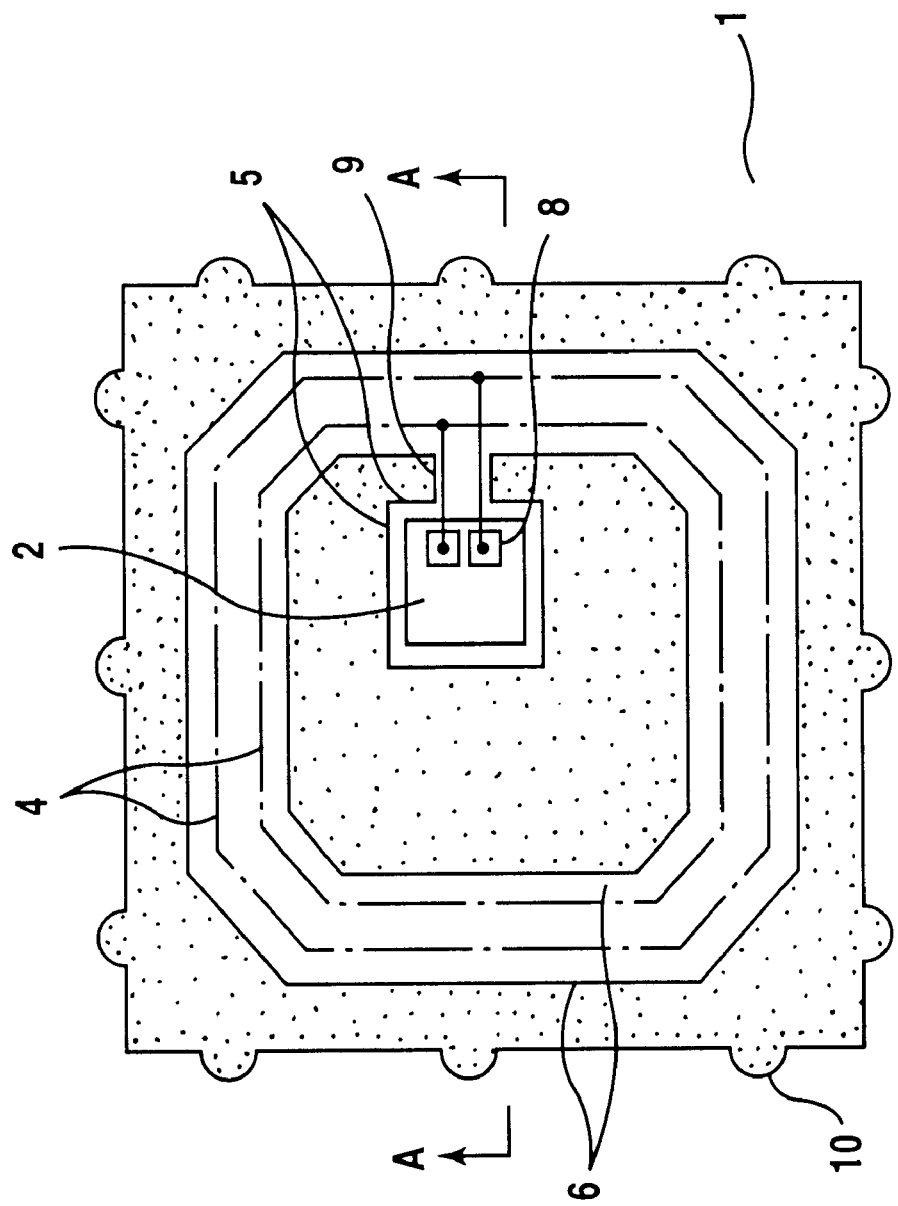
FIG. 1 is an illustration to show a state in which mounted parts are attached onto a support member in a first embodiment of the invention.

Therefore, in the first embodiment, as shown in FIG. 1, a support member 1 is previously molded, an IC card insulating substrate 2 is placed thereon, and the support member 1 on which the IC card insulating substrate 2 is placed, is placed in a metal mold, then again molded by a thermoplastic resin 3. The poured and melted thermoplastic resin 3 strikes on the support member 1 and the surface of the striking portion is melted. Therefore, full mold covering the rear face of the substrate 2 is enabled.

An IC card module according to a first embodiment of the invention will be discussed with reference to FIG. 1 to FIG. 5.

Figure 2:
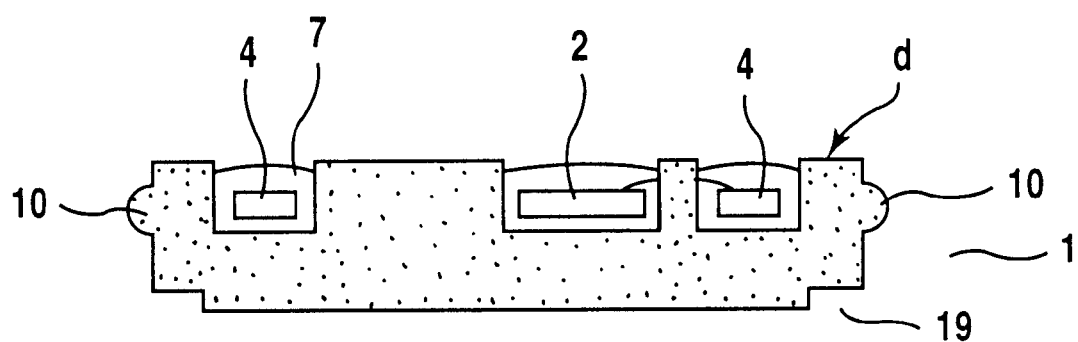
FIG. 2 is a sectional view taken on line A—A in FIG. 1.
Figure 3:
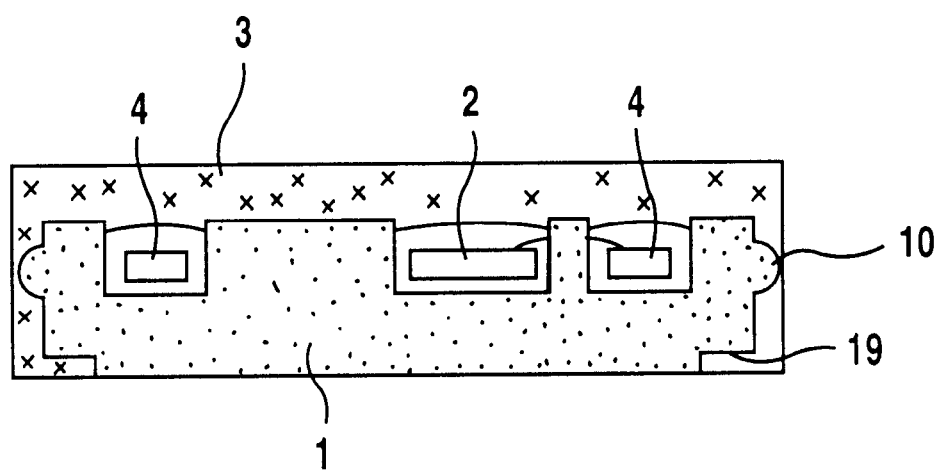
FIG. 3 is an illustration to describe a hybrid integrated circuit module with the support member in FIG. 2 molded of a sealing member in the first embodiment of the invention.

FIG. 1 shows a state in which the IC card insulating substrate 2 and a coil 4 are mounted on the support member 1. FIG. 2 is a sectional view taken on line A—A in FIG. 1. FIG. 3 shows a state in which a sealing member 3 made of a thermoplastic resin is provided in FIG. 2.

The support member 1 is previously molded of a thermoplastic resin and coil 4 and insulating substrate 2, which refers to a substrate, at least a surface of which to be formed on, with a conductive pattern, is undergone insulating treatment, are at least mounted on the support member 1. An adhesive, etc., may be applied to the rear faces of the mounted parts for fixing the mounted parts. However, here, a first groove 5 and a second groove 6 are formed when the support member 1 is molded; the insulating substrate 2 is placed in the first groove 5, the coil 4 is placed in the second groove 6, and a thermosetting resin, such as an epoxy resin 7, is applied for protecting and fixing them. The coil 4 is connected to electrodes 8 of the insulating substrate 2 through solder and to form a coil derivation part 9, the first groove 5 and the second groove 6 are made connected through the derivation part 9.

The coil varies in size (whole plane area containing a hollow part) depending on whether the coil is used for generating a magnetic flux signal and sending it, or the coil is used for receiving a magnetic flux signal and taking out it as an input signal. That is, since a signal is received at the coil, if the size of the link indicated by the phantom line indicating the coil grows large, the amount passing through the magnetic flux increases, thus a signal is easily input. Thus, the grooves and the coil are formed so that the coil of a size as large as possible can be placed in the support member 1 of a substantial rectangle. If corners are at the right angle like the corners of the support member 1, the insulating film of the coil is easily broken, thus the corners are chamfered. Since they are chamfered one round, an octagon is formed.

Ceramic, metal, a printed-circuit board, a glass substrate, a flexible sheet, or the like is possible as the IC card insulating substrate.

Particularly, if a metal substrate or an insulating substrate close to the metal substrate in thermal conductivity is adopted as the IC card insulating substrate 2, the substrate temperature rises in a metal mold because the pouring temperature of the thermoplastic resin 2 is high. However, since the substrate acts as a heat sink, temperature rise on the IC card insulating substrate 2 and melting of solder formed on the insulating substrate 2 can be prevented.

Although not shown, a conductive pattern made of, for example, Cu is formed on the insulating substrate 2 and active elements of transistors, ICs, etc., and passive elements of chip resistors, chip capacitors, etc., are mounted through solder, providing predetermined circuitry. Here, without adopting solder for a part, electric connection may be made by silver paste, etc. If the semiconductor elements, etc., are mounted face up, connection may be made through fine metal wires by bonding.

Subsequently, the support member on which the parts are mounted as shown in FIG. 2 is placed in a metal mold and melted thermoplastic resin 3 is poured for molding. The thermoplastic resin 3 for sealing is provided by injection molding, for example, and the resin pouring temperature is extremely high (about 300 degrees). To insert the IC card insulating substrate 2 having circuit elements mounted by solder into the metal mold and molding integrally, the solder is melted due to the poured high-temperature resin, causing cold solder of the elements. This problem noticeably arises particularly on a resin-based printed-circuit board because thermal conductivity is low. However, in the invention, because of covering with the thermosetting resin 7, heat transmission to the solder is suppressed and melting of the solder can be prevented. Moreover, if an epoxy resin is used, slipping of fine metal wires can also be prevented. This topic will be discussed later.

When the support member 1 is molded, a filler for improving thermal conduction is entered in a thermoplastic resin, the support member 1 itself absorbs heat as a heat sink, so that melting of solder can be furthermore prevented.

Here, PPS (polyphenylene sulfide) is adopted as the thermoplastic resin. The metal mold temperature is fairly lower than that of transfer mold; it is about 130 degrees or lower. A liquid resin at 300 degrees is poured into the metal mold and is rapidly cooled and solidified in the metal mold at lower temperature. This cycle, which is about 10–20 seconds, is drastically shortened as compared with the transfer mold cycle (30–180 seconds).

When the IC card insulating substrate 2 with the circuit elements mounted is molded of the thermoplastic resin 3, it is advisable to previously pot the solder joint part, bonding wire and bare chip with the thermosetting resin 7, such as epoxy resin. Further, preferably the thermosetting resin has a thermal expansion coefficient equal to that of the IC card insulating substrate 2.

That is, the above-described measure has the effect of particularly preventing fine metal wire (100 $\mu$m or less) from falling down or being broken by poured resin pressure at the molding time of the thermoplastic resin 3. Generally, it is considered that if a thermoplastic resin is used as a sealing material, the potting resin is also a thermoplastic resin. However, the thermoplastic resin 3 is only in contact with the IC card insulating substrate 2 after molding and does not react with the substrate and is not bonded thereto. Thus, a stress occurs in the wire connection parts also containing fine and solid lines and solder connection parts because of thermal expansion coefficient mismatch between the thermoplastic resin 3 and the mounted parts and between the IC card insulating substrate 2 and the thermoplastic resin 3 as thermal shock occurs. Particularly, because of no reaction with the thermoplastic resin, wire slip occurs from warpage of the substrate and a broken line, etc., occurs. However, if an epoxy resin is adopted as the potting resin 7, the epoxy resin itself strongly reacts with the sealing content and is bonded, thus slip is suppressed and the problems can be solved. Since the melted thermoplastic resin 3 does not come in direct contact with solder at the molding time, temperature rise in the solder portion can be suppressed. When a metal substrate is adopted, it acts as a heat sink as described above. Further, if the solder is coated with a resin, melting of the solder can be prevented furthermore reliably. With printed-circuit boards, ceramic substrates, etc., inferior in conductivity, solder is coated with a resin and the resin thickness and resin pouring temperature are adjusted, whereby melting of the solder can also be prevented and the printed-circuit boards, ceramic substrates, etc., can be used.

The thermosetting resin 7 has also the following merit: If the resin 7 is placed in a groove, when molding of the thermoplastic resin 3 is executed, a dent is produced in the surface of the mold member 3 corresponding to the groove and a phenomenon called a surface sink occurs, resulting in an appearance failure. Also, the strength of the support member 1 drops. That is, when the melted thermoplastic resin 3 is poured and solidified, the whole warps because of contraction. However, the groove is covered with the thermoplastic resin, thus the surface sink can be suppressed and the strength improves; the problems can be solved. When a surface sink occurs and the appearance is unsightly, all the area of the side where the surface sink occurs is made into satin worked surface, whereby judgement in a visual inspection is made hard to make.

As seen in FIG. 2, steps 19 are provided in the surroundings of the rear face of the support member 1 for improving adhesion to the poured thermoplastic resin 3.

Figure 4:
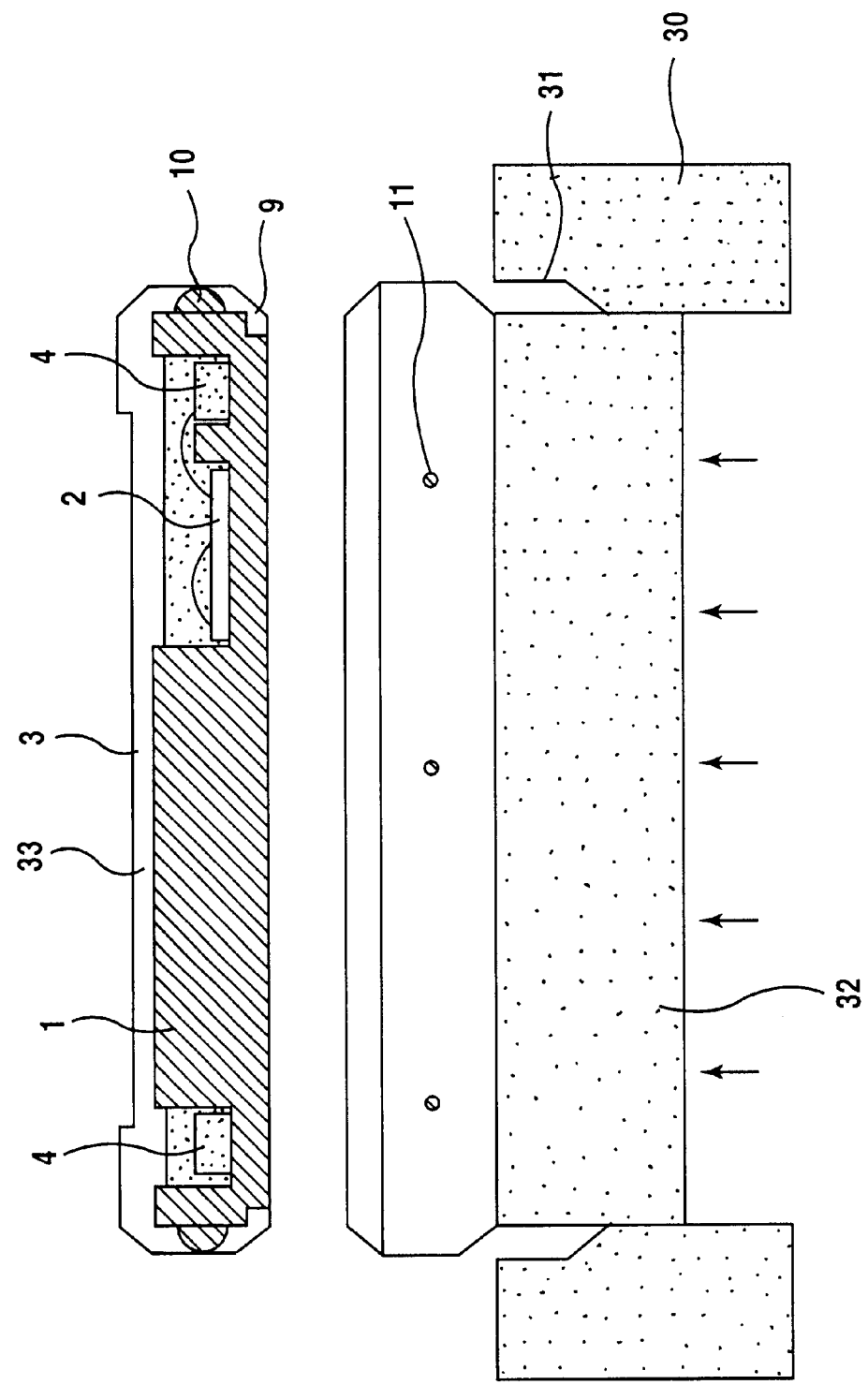
FIG. 4 is an illustration to describe a state of placing the support member in a metal mold.

Further, the support member 1 abutting a side of a lower metal mold is provided with means for coming in plane, line, or point contact therewith. In FIG. 3, semispherical abutment means 10 is provided. The abutment means 10 has the two merits: One merit is to provide a good resin pouring passage in forming a gap between a side of the support member 1 and a side of the metal mold and sealing also containing the steps 19 and the sides. As the other merit, if the abutment means is not provided, a gap cannot be formed and the side is not coated with a thermoplastic resin either. That is, if sealing is executed without providing the abutment means, the interface between the support member 1 and the sealing member 3 made of the thermoplastic resin becomes d and a problem is left in moisture resistance. However, if the support member 1 is abutted in point or line as in FIG. 3, the sides of the support member 1 are almost covered with the sealing member, so that the moisture passage can be extended and moisture resistance can be improved. In FIG. 4, numeral 11 exaggeratedly shows a trace of the abutment means after sealing with the sealing member 3. A completely sphere would be exposed at a substantial point. If a gap is somewhat formed, the portion exposed at a point can be covered thinly.

Figure 5:
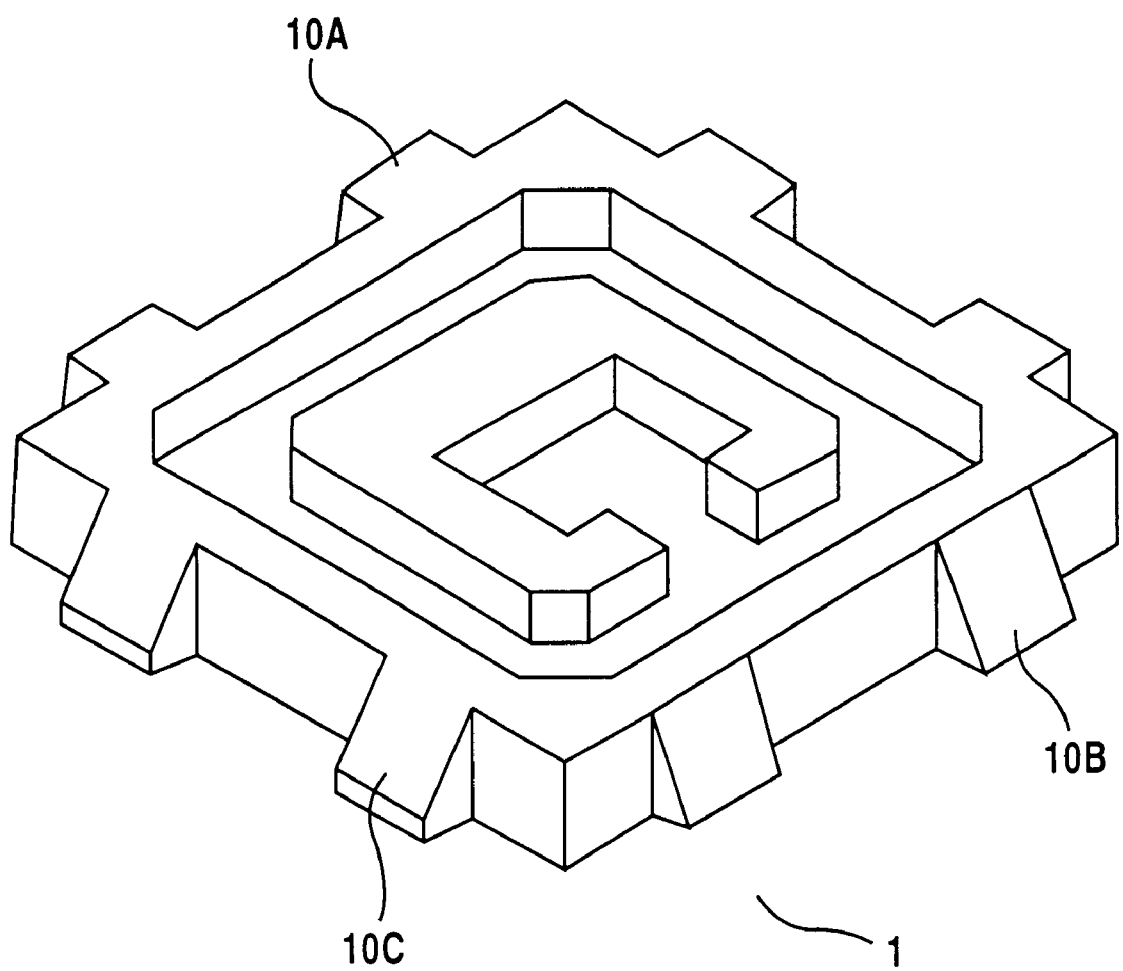
FIG. 5 is an illustration to describe abutment means.

FIG. 5 shows three types of abutment means of the support member 1. Numeral 10A is abutment means of a rectangular parallelopiped for coming in plane contact with a metal mold. Numeral 10B is abutment means provided by cutting the rectangular parallelopiped to a half and having triangular sides for coming in line contact with a metal mold. Numeral 10C is abutment means provided by cutting the corners of the abutment means 10B for somewhat coming in plane contact with a metal mold.

In any way, if the abutment means does not exist, a resin cannot be formed in the sides or the steps 19. That is, if an attempt is made to form a gap without providing the abutment means, when the support member 1 is placed in a metal mold, clearance is produced and resin pouring pressure is high, thus good molding cannot be executed.

A thickness problem also occurs between the support member 1 and the sealing member 3. Although the support member 1 is previously formed, the sealing member 3 abuts the support member 1 in a metal mold and is solidified. When the sealing member 3 is solidified, it contracts, thus the support member 1 needs to be thickened so as not to warp against the contraction of the sealing member 3. Conversely, the sealing member 3 needs to be thinned.

Figure 6:
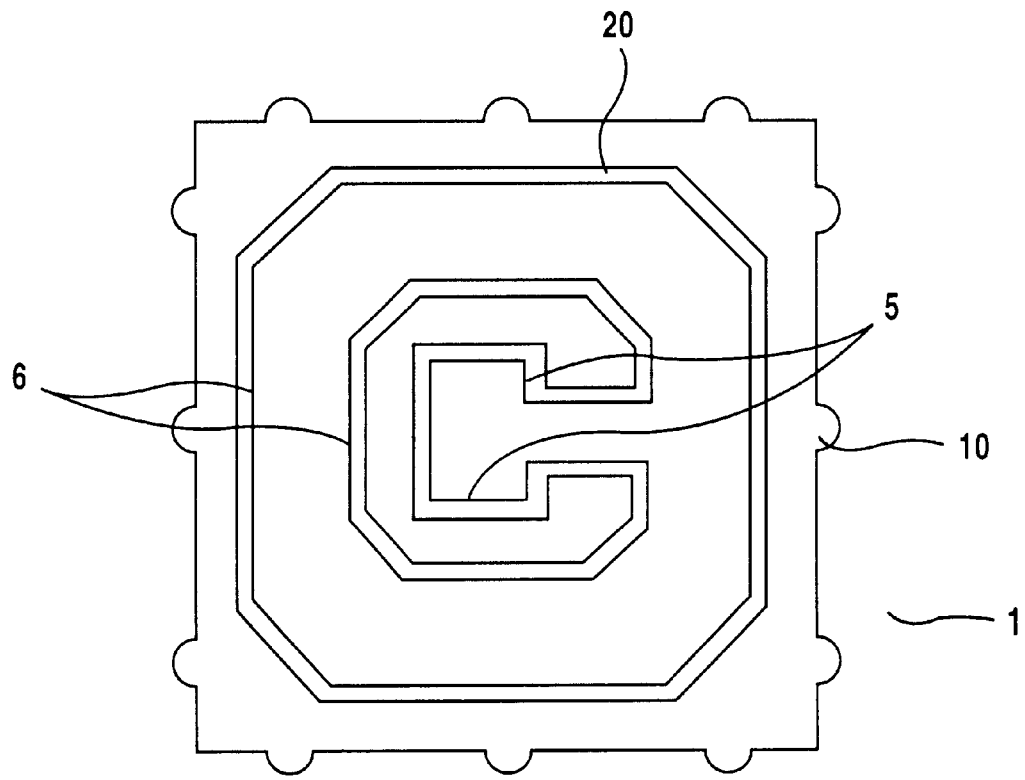
FIG. 6 is an illustration to describe a support member in a second embodiment of the invention.
Figure 7:
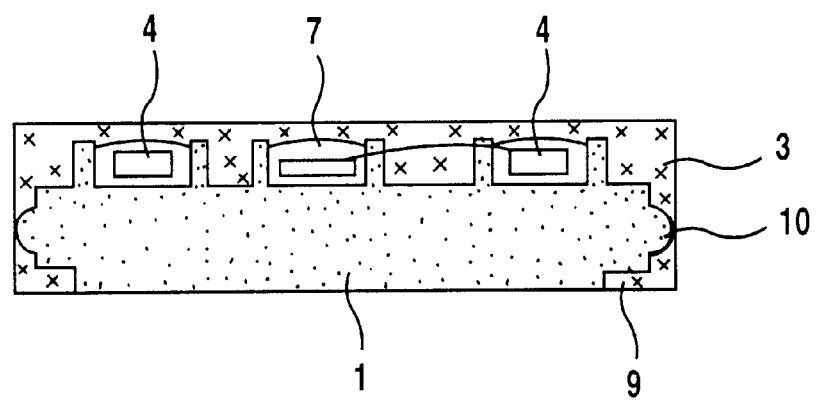
FIG. 7 is an illustration to describe a hybrid integrated circuit module using the support member in FIG. 6.

Subsequently, a second embodiment of the invention will be briefly discussed with reference to FIG. 6 and FIG. 7. FIG. 6 shows the shape of a support member 1. FIG. 7 shows the support member 1 on which a coil 4 and an IC 7 are mounted, sealed with a thermoplastic resin. In the first embodiment, the first and second grooves which are each a rectangular parallelopiped in cross section are formed; in the second embodiment, a projection wall 20 like a castle wall is provided for forming a groove. Because of such an uneven shape (having an indented surface), the contact plane with the sealing resin widens and the sealing strength and moisture resistance can be improved. However, because of the uneven shape, a surface sink occurs and to prevent it, a thermosetting resin needs to be applied to the whole face.

In both the first and second embodiments, steps 19 are provided, whereby adhesion to a poured resin improves. However, since the support member 1 is made of a thermoplastic resin, if it is attached to a metal mold and a resin is poured, deformation may occur because a gap exists in each step. Therefore, if a projection having the same level as the rear face of the support member 1 is attached to each step, the problem can be solved. The size, the shape, the number of pieces, and the like are determined considering the IC card module size, injection pressure, etc.

For the support member 1, particularly requiring external heat radiation, a filler for improving thermal conductivity may be mixed into the support member 1 considering substrate temperature rise caused by poured resin 3. For example, alumina, $SiO_2$, etc., is mixed. Resin is also brought into the rear face of an island fixedly secured to a transistor like transfer mold of a transistor chip. If a gap is made in the rear face and resin for the support member 1 is poured to mold the support member 1 and an IC card insulating substrate 2 in one piece in a metal mold, thermal conductivity is excellent and heat is absorbed in the metal mold at the molding time and is not brought into the whole rear face of the substrate. Therefore, it is important to previously provide the support member 1 and place mounted parts therein. A thermoplastic resin into which a filler is not mixed is used as the poured resin 3; otherwise, heat of the poured resin 3 is absorbed in a metal mold and the poured resin 3 is solidified at a midpoint of the IC card insulating substrate 2.

Last, a metal mold will be briefly discussed with reference to FIG. 4. The upper part of FIG. 4 is a perspective view of a complete IC card module and the lower part is an illustration of the IC card module pushed out by a push-out pin of a plane push structure. Numeral 30 is a lower metal mold. Abutment means 10 attached to the support member 1 abuts a metal mold side 31. An upper metal mold (not shown) is closed for forming a seal space, and a melted thermoplastic resin is poured into the space. The poured resin is injected from between the abutment means 10 and 10 to step 19 and is solidified due to the metal mold temperature. If a fine pin is used, a trace is left, thus a pin 32 of a plane push structure is used as the push-out pin. Since the abutment means 10 is shaped like a semisphere, some traces are left, but can be made inconspicuous by performing satin finish to the surface of the abutment means 10. A dent 33 is a portion for the user to put a used seal, etc.

Figure 8:
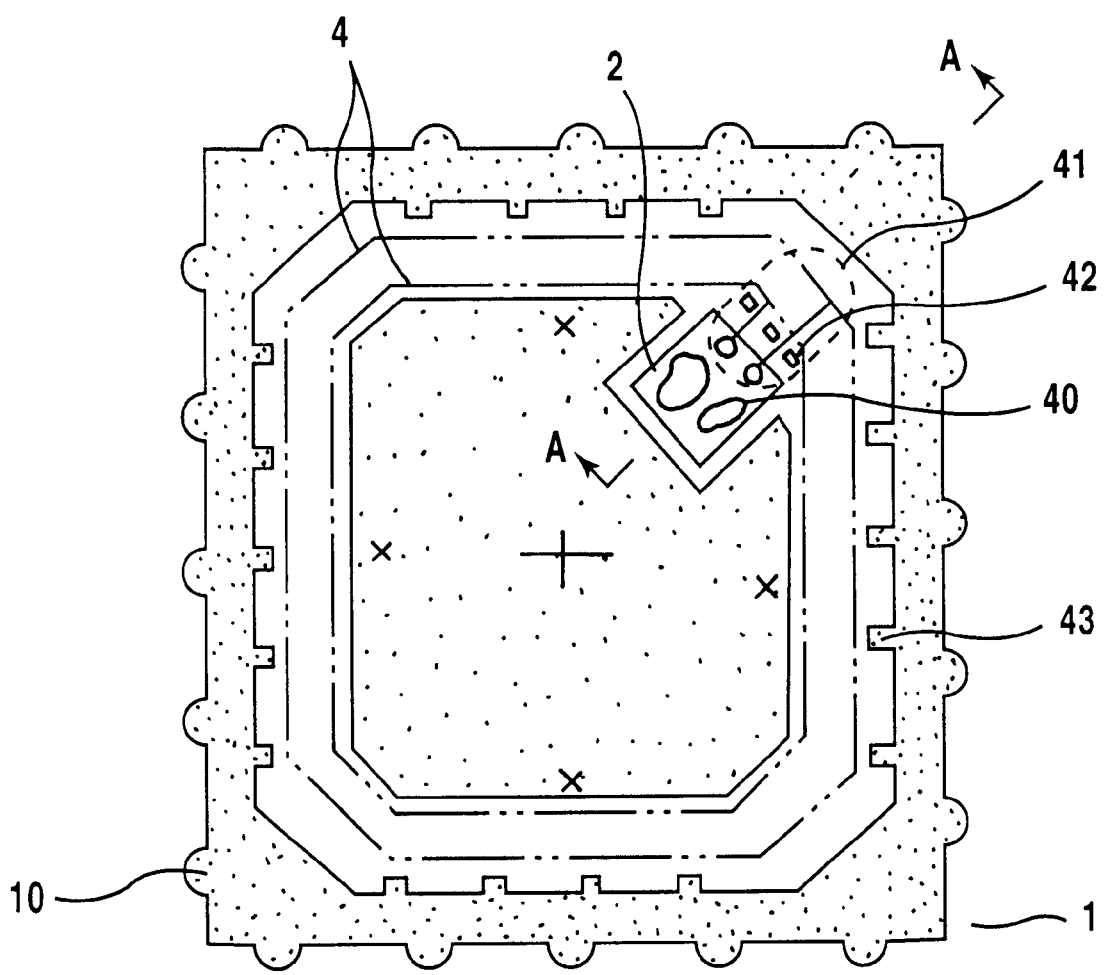
FIG. 8 is an illustration to describe a support member resulting from a little modifying the support member in FIG. 1.

FIG. 8 shows placement of the area in which the insulating substrate 2 is placed in FIG. 1 in a corner of the support member as such a structure not exerting a bending force on the insulating substrate. For example, if a person enters a complete module in a hip pocket, the module will be apt to be bent mostly at the center thereof. Therefore, if the insulating substrate can be placed in a quarter the area inside the coil (square area indicated by X mark) so that it is smaller than the quarter area, even if the module is bent, the insulating substrate of the circuit substrate is not affected. Numeral 40 is a potting resin (for example covering a semiconductor chip, numeral 41 is a potting resin covering a coil derivation area, and numeral 42 is a guide for preventing the derived coil from being short-circuited. Numeral 43 is a stopper regulating a move of the coil.

Figure 9:
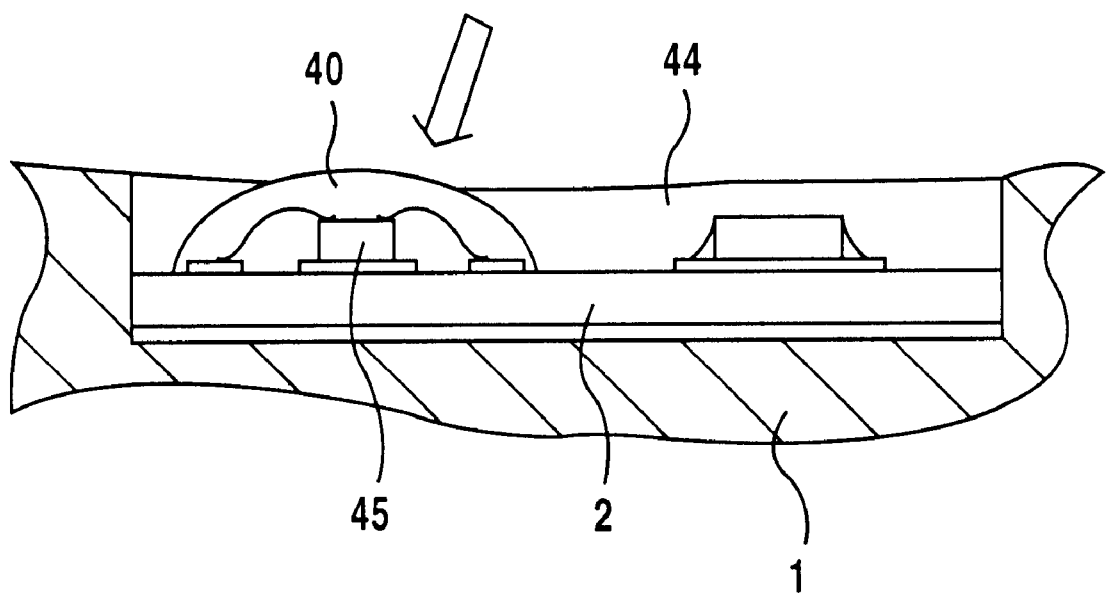
FIG. 9 is an illustration to describe a problem arising in the potting structure of a semiconductor chip.

FIG. 9 is a sectional view taken on line A—A in FIG. 8, wherein the potting resin 40 covers a semiconductor chip 45 and further the groove is covered with an epoxy resin 44. If the epoxy resin 44 does not completely cover the potting resin 40, when thermoplastic resin is poured for sealing, pressure proper to injection is exerted on the portion indicated by the arrow and the semiconductor chip is broken. This phenomenon occurs because pressure is applied intensively to the potting part of the arrow portion. If the potting part is completely covered with the epoxy resin 44, pressure does not concentrate on the potting part, thus the semiconductor chip is prevented from being broken.

As described above, first, the thermoplastic resin is a material which is melted when reaching one temperature and is solidified when cooled, thus the support member molded of a thermoplastic resin previously placed in a metal mold is melted upon reception of the heat of a poured thermoplastic resin and is integrated. Therefore, the IC card insulating substrate is molded in one piece with the support member and the poured thermoplastic resin and the rear face of the substrate can be covered. The dielectric strength characteristic and moisture resistance can be improved.

Second, although the injection pressure of the thermoplastic resin is large, the mounted parts do not shift and are not destroyed as the grooves are formed.

Third, since the solder of the conductive pattern of the IC insulating substrate is covered with the resin, although the melting temperature of the thermoplastic resin is very high (about 300 degrees), the heat of the directly melted, poured resin is not transmitted and solder melting can be prevented.

Fourthly, the injection pressure of the thermoplastic resin, for example, a PPS resin comes up to about 50–200 Kg/cm2 and causes the coil or the insulating substrate to shift, but the coil and the substrate are buried in the grooves and therefore the shift can be prevented and sealing is enabled in addition to preventing of melting of the solder described above.

Fifthly, the thermoplastic resin is a material which is melted when reaching one temperature and is solidified when cooled, thus the support member molded of a thermoplastic resin previously placed in a metal mold is melted upon reception of the heat of a poured thermoplastic resin and is integrated.

Therefore, the IC card insulating substrate is molded in one piece with the support member and the poured thermoplastic resin and the rear face of the substrate can be covered. The dielectric strength characteristic and moisture resistance can be improved.

Sixthly, although the injection pressure of the thermoplastic resin is large, the mounted parts do not shift and are not destroyed as the grooves are formed.

Seventhly, since the solder of the conductive pattern of the IC insulating substrate is covered with the resin, although the melting temperature of the thermoplastic resin is very high (about 300 degrees), the heat of the directly melted, poured resin is not transmitted and solder melting can be prevented.

Eighthly, the injection pressure of the thermoplastic resin, for example, a PPS resin comes up to about 50–200 Kg/cm2 and causes the coil or the insulating substrate to shift, but the coil and the substrate are buried in the grooves and therefore the shift can be prevented and sealing is enabled in addition to preventing of melting of the solder described above.

Ninthly, the thermoplastic resin is a material which is melted when reaching one temperature and is solidified when cooled, thus the support member molded of a thermoplastic resin previously placed in a metal mold is melted upon reception of the heat of a poured thermoplastic resin and is integrated. Therefore, the IC card insulating substrate is molded in one piece with the support member and the poured thermoplastic resin and the rear face of the substrate can be covered. The dielectric strength characteristic and moisture resistance can be improved.

Tenthly, although the injection pressure of the thermoplastic resin is large, the mounted parts do not shift and are not destroyed as the grooves are formed.

Eleventhly, since the solder of the conductive pattern of the IC insulating substrate is covered with the resin, although the melting temperature of the thermoplastic resin is very high (about 300 degrees), the heat of the directly melted, poured resin is not transmitted and solder melting can be prevented.

Twelfthly, the injection pressure of the thermoplastic resin, for example, a PPS resin comes up to about 50–200 Kg/cm2 and causes the coil or the insulating substrate to shift, but the coil and the substrate are buried in the grooves and therefore the shift can be prevented and sealing is enabled in addition to preventing of melting of the solder described above.

Thirteenth, by potting with a first resin (in this case, epoxy resin) reacting with the sealed material (semiconductor bare chip, fine metal wires or coil) and sealing with the thermoplastic resin, no slip occurs if the support member warps due to heat.

Fourteenthly, by applying satin work to the face of the sealing member where a surface sink occurs, opposed to the bottom of the support member, visual check can be made hard to make.

Fifteenthly, by placing a potting resin for covering a semiconductor bear chip, placing a second resin for covering a first groove so as not to expose the surface of the potting resin, placing the support member in a metal mold, and sealing the support member with a thermoplastic resin, the resin pouring pressure at the sealing time is not directly applied to the potting resin, so that destructing of the chip can be prevented.

What is claimed is:

1. An IC card module comprising:
   a support member being made of a thermoplastic resin and having a first groove and a second groove in which at least a substrate and a coil are mounted;
   said substrate being mounted in the first groove and having a semiconductor IC electrically connected to a conductive pattern formed on a surface of said substrate;
   said coil being mounted in the second groove and electrically connected to the conductive pattern of said substrate through solder;
   a thermosetting resin provided to cover the semiconductor IC and the solder; and
   a sealing member made of a thermoplastic resin into which an exposure part of said support member is melted and integrated to be molded into one body so as to substantially seal said substrate and an entire surface of said support member except for a bottom surface.

2. The IC card module as claimed in claim 1 wherein said first groove and second groove are embedded with the thermosetting resin.

3. The IC card module as claimed in claim 1, wherein said support member comprises means for abutting a metal mold die on one of a plane, a line, and a point on a side surface of the support member.

4. The IC card module as claimed in claim 1, wherein as thickness relationship between said support member and said sealing member, said sealing member is thinned so that said support member can be prevented from warping.

5. The IC card module as claimed in claim 4, wherein the thickness of said sealing member is thinner than that of said support member.

6. The IC card module as claimed in claim 1, wherein the thermoplastic resin is made of polyphenylene sulfide.

7. The IC card module as claimed in claim 1, wherein said support member being made of a thermoplastic resin and said sealing member made of a thermoplastic resin are melted and integrated with each other.

8. The IC card module as claimed in claim 7, wherein the thermoplastic resin is made of polyphenylene sulfide.

9. A hybrid integrated circuit card module comprising:
   a support member being made of a thermoplastic resin and having a first groove and a second groove in which at least a substrate and a coil are placed;
   said substrate being mounted in the first groove and having a semiconductor bare chip electrically connected to a conductive pattern formed on a surface of said substrate;
   said coil being mounted in the second groove and electrically connected to the conductive pattern of said substrate through solder;
   a thermosetting resin provided to cover the semiconductor bare chip and the solder; and
   a sealing member made of a thermoplastic resin into which an exposure part of said support member is melted and integrated to be molded into one body so as to cover the thermosetting resin and substantially seal said substrate and the sealing member which does not touch with the semiconductor bare chip and the solder.

10. The hybrid integrated circuit card module according to claim 9, wherein the first groove and second groove are embedded with the thermosetting resin to cover the substrate and the coil.

* * * * *